United States Patent [19]

Mariani

[11] Patent Number: 5,059,848
[45] Date of Patent: Oct. 22, 1991

[54] LOW-COST SAW PACKAGING TECHNIQUE

[75] Inventor: Elio A. Mariani, Hamilton Square, N.J.

[73] Assignee: The United States of America as represented by the Secretary of the Army, Washington, D.C.

[21] Appl. No.: 569,810

[22] Filed: Aug. 20, 1990

[51] Int. Cl.[5] ............................................. H01L 41/08
[52] U.S. Cl. ................................ 310/313 R; 310/344; 310/346
[58] Field of Search .................... 310/313 R, 346, 344; 333/155, 195

[56] References Cited

U.S. PATENT DOCUMENTS

| | | | |
|---|---|---|---|
| 4,047,129 | 9/1977 | Ishiyama | 310/313 R |
| 4,213,104 | 7/1980 | Cullen et al. | 333/155 X |
| 4,295,102 | 10/1981 | Schmidt et al. | 310/313 R |
| 4,296,347 | 10/1981 | Weirauch | 310/344 X |
| 4,333,342 | 6/1982 | Gilden et al. | 313/313 R |
| 4,737,742 | 4/1988 | Takoshima et al. | 310/313 R X |
| 4,845,397 | 7/1989 | Herrick et al. | 310/313 R X |
| 4,933,588 | 6/1990 | Greer | 310/313 R X |

OTHER PUBLICATIONS

"A Miniature Hybrid Circuit SAW Oscillator Using an All Quartz Packaged Resonator", by Montress et al., (1985 IEEE Ultrasonic Symposium Proceedings).

*Primary Examiner*—Mark O. Budd
*Attorney, Agent, or Firm*—Michael Zelenka; William H. Anderson; Robert A. Maikis

[57] ABSTRACT

A low-cost SAW device package comprises a ceramic or glass carrier chip, a SAW device substrate mounted on the carrier chip via a conventional adhesive and a package cover mounted over the SAW device by a glass frit. The glass frit provides a tight vacuum seal for the SAW device so that outside contamination is prevented. The package cover is fabricated of a low-cost nonmetallic, non-single crystalline material (i.e. glass) having thermal characteristics similar to or the same as those of the SAW device substrate. The packaged SAW device is mounted into a circuit or subsystem using conventional bonding techniques.

1 Claim, 1 Drawing Sheet ns between each transducer bus-bar and any impedance matching circuitry on the carrier chip used with the SAW device. Ground metallization is also disposed on the carrier chip providing for electrical ground connection. The cover is fabricated of nonmetallic, non-single crystalline material having thermal characteristics similar to those of said SAW device substrate so that thermal induced stresses are eliminated.

LOW-COST SAW PACKAGING TECHNIQUE

GOVERNMENT INTEREST

The invention described herein may be manufactured, used and licensed by or for the Government without payment to me of any royalty thereon.

TECHNICAL FIELD

The present invention relates generally to analog/acoustic signal processing devices, and more particularly to packages for various kinds of SAW (surface acoustic wave) devices comprising a low-cost temperature-stable package configuration.

BACKGROUND OF THE INVENTION

SAW devices find utility in a number of different applications including resonators, filters and oscillators. Some advantages of SAW devices include small size, high device uniformity, temperature stability, and flexibility of device function. When using SAW devices in, for example, high frequency oscillator circuits, stable frequency characteristics are required. Therefore, the SAW oscillator must be protected from environmental contamination which can produce changes in the acoustic wave propagation velocity. Any change in velocity results in a change in the SAW delay time (the real time delay provided by the SAW) which in causes frequency shifting of the SAW oscillator. To prevent this outside contamination, vacuum encapsulation of the device is required.

Vacuum encapsulation of a SAW device involves packaging the device with a cover in a vacuum. Although vacuum encapsulation has solved the problem of contamination, problems associated with SAW packages can arise from temperature induced stresses caused from the difference in thermal characteristics of the device substrate and the package cover. As a result, the wave propagation velocity and the SAW time constant become distorted. Furthermore, where there have been matching thermal characteristics between the cover and the substrate as in "A Miniature Hybrid Circuit SAW Oscillator Using An All Quartz Packaged Resonator", by Montress et al., (1985 IEEE Ultrasonic Symposium Proceedings), and U.S. Pat. No. 4,213,104 to Cullen, high package cost has been a problem.

SUMMARY OF THE INVENTION

It is therefore an object of the invention to provide a SAW package with both high temperature stability and low cost.

It is a further object of the invention to provide a SAW package compatible with state of the art impedance matching and surface mounting technology in use for circuit implementation.

The above and other objects of the invention are achieved in accordance with the invention wherein a SAW device package comprises a low-cost carrier chip, a SAW device adhesively-mounted on the carrier chip and a package cover mounted over the SAW device. The SAW device comprises a piezoelectric substrate whereon a pair of interdigital transducers are disposed for signal input/output purposes. A glass frit bonds the cover to the device substrate providing a vacuum tight seal thereby preventing outside contamination. The device substrate and the transducer bus-bars thereon extend beyond the electrically insulating glass frit and the package cover thereby enabling electrical intercon-

BRIEF DESCRIPTION OF THE DRAWINGS

The invention will be more fully appreciated from the following detailed description when the same is considered in connection with the accompanying drawings in which.

DETAILED DESCRIPTION

Figure 1:
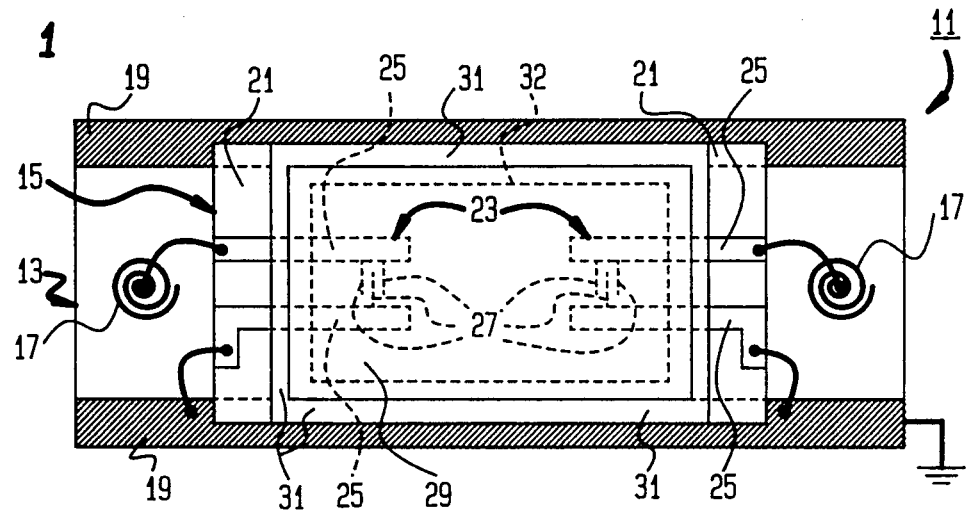
FIG. 1 is a top view of the SAW device package in accordance with the present invention.

Referring now to the drawings, wherein like refernce als refer to like parts throughout, reference will first be made to FIG. 1 wherein the inventive device package is shown generally by reference numeral 11 . Reference numeral 13 designates a carrier chip. The carrier chip 13 is typically fabricated of glass or ceramic material and provides the surface for mounting the SAW device 15. The carrier chip is large enough to provide appropriate areas for integrated impedance matching networks 17 and a metallized area 19 for an electrical ground connection. The SAW substrate 15 is mounted to the carrier chip 13 using a conventional adhesive (e.g. RTV) and overlaps the metallized area 19. The SAW device 15 may have any one of a number of known SAW configurations which includes a planar substrate 21 on which a pair of thin-film interdigital transducers 23 are disposed for signal input/output purposes. The transducers launch and receive the acoustic waves propagating on the substrate 21. The substrate 21 is made of known piezoelectric substrate materials such as lithium niobate or quartz.

Each transducer 23 comprises a pair of bus bars 25 having electrodes 27 extending and interdigitating from bus bars 25. There are a number of different interdigital transducer configurations, including variations in the interdigital pattern itself, which may be used in the present invention. The SAW device shown in FIG. 1 which may be used as a bandpass filter in a television set illustrates one possible configuration. The exact configuration of the interdigital transducers is not critical to the present invention.

Figure 2:
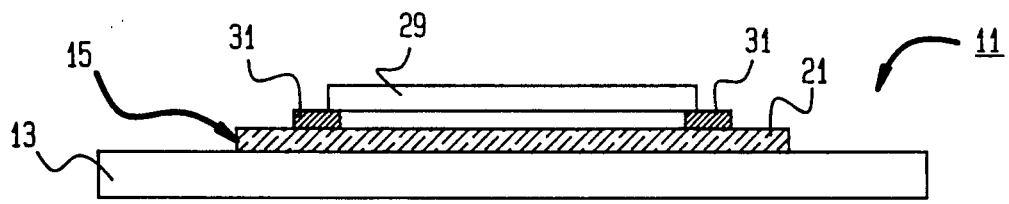
FIG. 2 is a side view of the SAW device package.

A package cover 29 is mounted over the SAW device substrate 21 using a glass frit seal 31 (dotted line 32 to edge of substrate 21) that separates the cover 29 from the SAW surface 21. This is more readily apparent in FIG. 2 which provides a side view of the SAW device 11 of FIG. 1. The substrate 21 and bus bars 25 thereon, extend under the insulating glass frit seal 31 and package cover 29 thereby enabling electrical interconnections between each transducer and associated impedance matching circuity. The sealed device provides a hermetic package.

The process of sealing the cover to the substrate involves depositing the glass frit onto the substrate 21 of the SAW device thereafter placing the package cover 29 on the glass frit. The SAW device 15, and package cover 29 combination is then placed in a vacuum chamber wherein it is heated to a temperature above the frit melting point. The typical melting temperature for a vitreous glass frit is approximately 425° C. with a firing time of 15 minutes. After the frit becomes molten, the oven temperature is reduced and the bonded structure is allowed to cool. The frit acts as a bonding layer between the package cover and the substrate 12, providing a vacuum tight seal thereof. The fritting process is one of a number of methods which may be utilized in forming the bonding layer between the package cover and the substrate.

The package cover 29 is fabricated of material with thermal characteristics similar to those of the substrate 21. Nonmetallic and non-single crystalline material such as glass or ceramic material is typically used, glass being the most preferable. The advantages of using glass as the cover material include its low cost, good thermal properties, and transparency, enabling one to view the substrate surface and transducers. If the thermal characteristics (e.g. coefficient of thermal expansion) of the package cover and the SAW substrate are dissimilar, undesirable strain occurs between the substrate and the cover, causing changes in the acoustic wave velocity and SAW time constant. The strain is greatly reduced or prevented when the cover and substrate have similar or matching thermal characteristics, thereby providing a SAW device having greatly improved stability characteristics for acoustic wave propagation.

Figure 3:
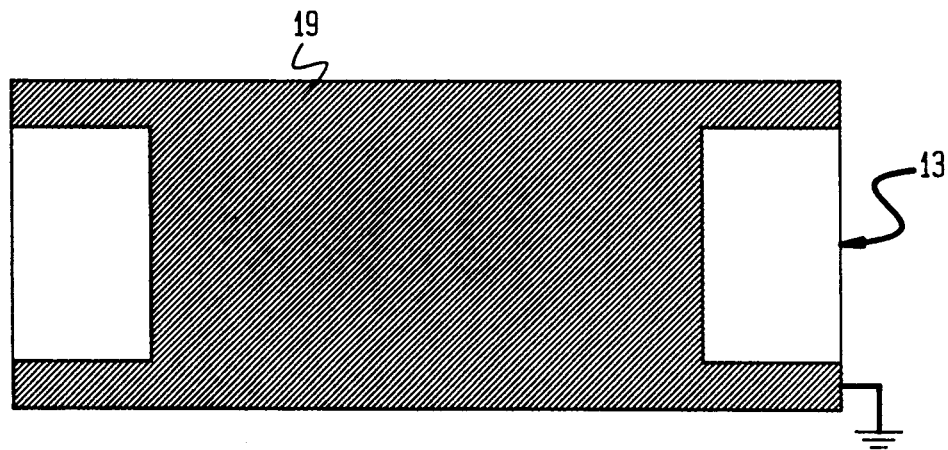
FIG. 3 is a top view of the carrier chip displaying ground metallization to improve electromagnetic shielding.

FIG. 3 shows a top view of the carrier chip 13 without the SAW device, cover and impedance matching networks, illustrating the ground metallization 19 of the carrier chip 13. The metallized area provides an electrical ground connection which also enhances transducer-to-transducer shielding (i.e. direct feedthrough of RF signal). The invention is not limited to this pattern of metallization.

Accordingly, while a particular embodiment of the invention has been described in detail herein, it is to be understood that numerous other embodiments may be devised by those skilled in the art without departing from the spirit and scope of the invention.

What is claimed is:

1. A surface acoustic wave (SAW) device package comprising:
   a SAW device having a substrate with an active area theron for the propagation and processing of SAWs;
   a planar carrier chip fabricated of glass material upon which said SAW device is mounted, said carrier chip extending beyond said SAW device substrate and having areas for disposing appropriate impedance matching circuits thereon and an area comprising metallization thereon, said metallized area being disposed on said carrier chip underneath said SAW device substrate and extending beyond said SAW device substrate to define said areas for disposing impedance matching circuits on said carrier chip to provide transducer-to-transducer shielding and an electrical ground for said SAW device; and
   a package cover fabricated of glass material mounted over the active area of said SAW device with a glass frit, said glass frit being disposed on said SAW device substrate surrounding the active area of said SAW device to separate said cover from said SAW device substrate and provide a vacuum tight seal between said cover and said SAW device substrate, said glass material having thermal characteristics similar to those of said SAW device substrate.

* * * * *